United States Patent [19]

Kim et al.

[11] Patent Number: 5,021,099
[45] Date of Patent: Jun. 4, 1991

[54] SOLAR CELL INTERCONNECTION AND PACKAGING USING TAPE CARRIER

[75] Inventors: Namsoo P. Kim, Bellevue; Billy J. Stanbery, Seattle, both of Wash.

[73] Assignee: The Boeing Company, Seattle, Wash.

[21] Appl. No.: 389,728

[22] Filed: Aug. 4, 1989

[51] Int. Cl.[5] ............................................. H01L 31/05
[52] U.S. Cl. ................................. 136/249; 136/244; 136/251; 437/2
[58] Field of Search ................... 136/244, 249 TJ, 251; 437/2-5

[56] References Cited

U.S. PATENT DOCUMENTS

| Re. 31,968 | 8/1985 | Mickelsen et al. | 136/260 |
|---|---|---|---|
| 3,553,030 | 1/1971 | Lebrun | 136/244 |
| 3,622,419 | 11/1971 | London et al. | 156/242 |
| 4,019,924 | 4/1977 | Kurth | 136/251 |
| 4,131,755 | 12/1978 | Keeling et al. | 136/244 |
| 4,133,697 | 1/1979 | Mueller et al. | 136/245 |
| 4,149,665 | 4/1979 | Costogue et al. | 28/5.1 |
| 4,219,926 | 9/1980 | Bloch et al. | 29/832 |
| 4,227,941 | 10/1980 | Bozler et al. | 136/255 |
| 4,232,070 | 11/1980 | Inouye et al. | 428/49 |
| 4,248,675 | 2/1981 | Bozler et al. | 204/38 A |
| 4,371,421 | 2/1983 | Fan et al. | 156/624 |
| 4,433,201 | 2/1984 | Fellas | 136/251 |
| 4,523,051 | 6/1985 | Mickelsen et al. | 136/260 |
| 4,547,622 | 10/1985 | Fan et al. | 136/249 |
| 4,574,160 | 3/1985 | Cull et al. | 136/245 |
| 4,677,528 | 6/1987 | Miniet | 361/398 |
| 4,680,422 | 7/1987 | Stanbery | 136/249 |
| 4,684,761 | 8/1987 | Devaney | 136/258 |
| 4,697,042 | 9/1987 | Schilling | 136/244 |
| 4,703,131 | 10/1987 | Dursch | 136/258 |

FOREIGN PATENT DOCUMENTS 1522618  8/1978  United Kingdom ................. 136/244

OTHER PUBLICATIONS

W. S. Chen et al.: "Development of Thin Film Polycrystalline $CuIn_{1-x}Ga_xSe_2$ Solar Cells;" Conference Record, 19th IEEE Photovoltaic Specialists Conference; Presented May 4, 1987; Published Oct. 1987, pp. 1445–1447.

J. C. C. Fan et al.: "Thin–Film GaAs Solar Cells;" Conference Record, 15th IEEE Photovoltaic Specialist Conference (1981), Copyright 1981; pp. 666–672.

R. P. Gale et al.: "High–Efficiency Double–Heterostructure AlGaAs/GaAs Solar Cells;" Conference Record 18th IEEE Photovoltaic Specialist Conference (1985), Copyright 1985; pp. 296–299.

R. W. McClelland et al.; "A Technique for Producing Epitaxial Films on Reuseable Substrates;" Appl. Phys. Lett. 37(6), Sep. 15, 1980; Copyright 1980 American Institute of Physics, pp. 560–562.

R. A. Mickelsen et al.; "Polycrystalline Thin–Film $CuInSe_2$ Solar Cells;" Proceedings of the Sixteenth IEEE Photovoltaic Specialists Conference, Sep. 1982; Copyright 1982 IEEE, pp. 781–785.

R. A. Mickelsen et al., "Development of $CuInSe_2$ Cells for Space Applications;" Conference Record 18th IEEE Photovoltaic Specialists Conference (1985); Copyright 1985 IEEE, pp, 1069–1073.

B. J. Stanbery et al.; "Thin Film Tandem GaAs/$CuInSe_2$ Solar Cells for Space Power Applications;" Proceedings of the Nineteenth IEEE Photovoltaic Specialists Conference, New Orleans, La., May 4–8 1987; Copyright 1987 IEEE; pp. 280–284.

Primary Examiner—Aaron Weisstuch
Attorney, Agent, or Firm—Christensen, O'Connor, Johnson & Kindness

[57] ABSTRACT

Individual solar cells are electrically interconnected through an interconnect circuit supported on a flexible dielectric substrate. The solar cells are connected directly to the interconnect circuit by contact fingers that are an integral part of the interconnect circuit. The interconnection of the individual solar cells can be accomplished by manual or automated process.

79 Claims, 5 Drawing Sheets

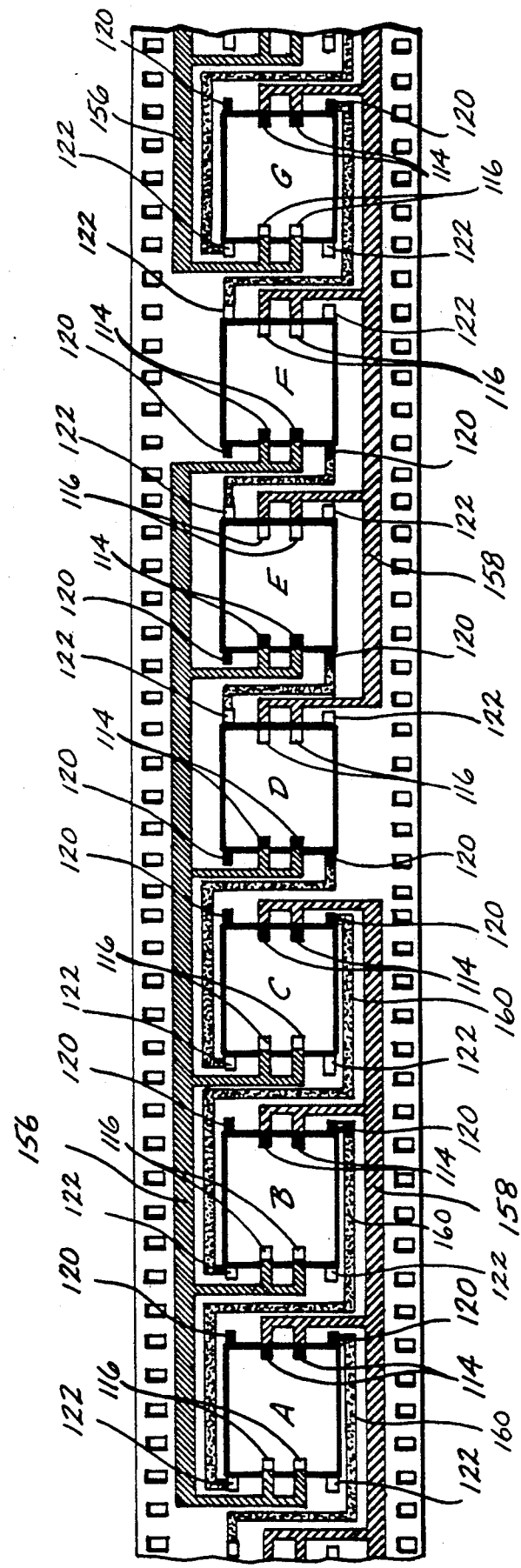

SOLAR CELL INTERCONNECTION AND PACKAGING USING TAPE CARRIER

This application is a continuation-in-part application of prior pending U.S. application Ser. No. 07/230,402 filed Aug. 9, 1988, now abandoned. The benefit of the filing date of which is hereby claimed under 35 U.S.C. §120.

BACKGROUND OF THE INVENTION

The present invention relates to solar cell arrays and a means of interconnecting individual cells of the solar cell array and packaging the same.

Solar cell arrays are widely used in space as the primary power source for spacecraft due to their reliability and light weight. Solar cell arrays are also useful in terrestrial applications as an alternative energy source to conventional fossil fuels, nuclear power, or hydroelectric power. When used in space applications, solar cell arrays are normally evaluated based upon three criteria: (1) efficiency of converting solar flux to electrical power; (2) mass of the solar cell array; and, (3) resistance to the space environment.

The general utility of most previously available solar cell arrays has been impaired by the complexity of the known fabrication techniques, attendant excessive costs in terms of time and materials, and low yields of production. Prior methods of interconnecting individual solar cells and packaging the solar cell array have provided operable results. However, with the increasing presence of solar-based power systems, and the decreasing cost of other energy sources, the efficiency of solar cell arrays must be maximized in order for the solar cell arrays to continue as a viable power source. One way to maximize efficiency is to pack the individual solar cells as closely together as possible. Unfortunately, the complexity of interconnecting solar cells has mitigated against maximizing the packing of the individual solar cells.

Also, the prior methods of fabricating interconnections between individual solar cells making up a solar cell array have provided less than satisfactory results with regard to protecting the solar cells and interconnect circuitry from degradation due to exposure to the space enviroment. Although it is well known that arrays of solar cells can be mounted on flexible substrates for use aboard satellites and the like, many of the previous solar cell arrays have included electrical circuitry that is deposited on top of or below the flexible substrate where it is directly exposed to the space environment. Because of the delicate nature of the flexible substrate, it is susceptible to erosion by atomic oxygen bombardment. Some of the materials used to fabricate the solar cells are also susceptible to erosion by atomic oxygen bombardment. Also, the direct exposure of the circuitry to the ambient plasma environment in the neighborhood of the spacecraft causes leakage currents to flow when high voltages are generated by the array.

One attempt to isolate the circuitry from direct exposure to the space environment is reported in U.S. Pat. No. 4,133,697 to Mueller, et al. The '697 patent isolates the electrical circuitry from the environment by sandwiching the circuitry between a pair of layers of a polyimide material, wherein at least one of the layers has a plurality of apertures containing solder pads. The solar cells are mounted on top of the layer including the apertures and an electrical connection between the solar cells and the circuitry results when the solder is heated to an elevated temperature and flows within the apertures. The solar cells used in the '697 patent are characterized by wrap-around electrical contacts that provide an electrical connection between the top surface of the solar cell and the bottom surface of the solar cell. However, the use of wrap-around contacts leads to an undesirable increase in the complexity of the fabrication of the individual solar cells and undesirable constraints on the design of the cell and array configuration.

Lightweight, high efficiency, and radiation resistant photovoltaic cells have been developed in order to meet the high specific power (watts/kilogram) requirements of spacecraft. One way of designing photovoltaic cells that have high specific powers is to reduce the weight of the semiconductor materials. One means of reducing the weight of a semiconductor is to reduce its overall thickness. Since most components of solar cells (including semiconductors, substrates and coverglasses) are relatively brittle, especially when made thin, decreasing the thickness of these semiconductors results in an increase in their fragility. The fragility of the semiconductors and photovoltaic cells that include such semiconductors becomes readily apparent during conventional fabrication of solar arrays when as many as 25 to 30 percent of the photovoltaic cells are damaged or broken.

Another way to improve the specific power of solar cells is to increase the conversion efficiency without weight penalty. Tandem cells can achieve this increase in conversion efficiency, be they mechanically stacked tandem cells or monolithically integrated multijunction photovoltaic cells. The mechanically stacked tandem cells include at least two subcells stacked one on top of the other and held together by an adhesive or other bonding techniques. The monolithically integrated multijunction cells include various semiconductor layers deposited directly on top of each other. The mechanically stacked tandem photovoltaic cells can be produced in yields that are greater than the yields obtained during the production of monolithically integrated multijunction photovoltaic cells. This greater yield is the result of the ability to (1) increase the process latitude of building subcells because the subcells are built independently of each other and (2) to select individual subcells for the mechanically stacked tandem cell that are optimally matched, in contrast, when producing the monolithically integrated multijunction photovoltaic cells, damage to, or poor performance of one of the subcells requires that the entire cell be replaced because the subcells cannot be separated without irreversible damage. Prior configurations of arrays for photovoltaic cells, particularly mechanically stacked tandem photovoltaic cells, have not provided the flexibility of electrical interconnection that is desired in order to efficiently design and optimize the performance of the array. Prior arrays for photovoltaic cells have also been less than satisfactory in their ability to prevent damage to the photovoltaic cells and interconnection schemes during fabrication, handling, deployment, and operation of the array.

SUMMARY OF THE INVENTION

The present invention solves the foregoing problems while satisfying the criteria by which solar cell arrays are evaluated for use in space applications. The present invention allows the interconnect circuitry between adjacent solar cells to be isolated from the ambient environment including atomic oxygen bombardment and space plasma, while minimizing the complexity of fabricating the solar cell array. The invention provides protection of the solar cells (particularly fragile thin cells needed for high specific power) and results in high yields during array fabrication and assembly as well as high reliability while in operation. Furthermore, the apparatus and method of the present invention provides an electrical interconnection scheme that is adaptable to a wide variety of solar cell configurations, e.g., tandem cells. The method of the present invention also lowers the cost of array fabrication by lending itself to automated manufacturing techniques.

The present invention provides solar cell arrays that are densely packed with the individual solar cells interconnected by an electrical circuit that is beneath and/or above the solar cells. The dense packing of the solar cells makes the entire solar cell array more efficient at converting solar flux to electrical power compared to less densely packed arrays. The present invention achieves the above-described results while minimizing the mass of the array and the area required to provide the interconnections between the individual solar cells.

The present invention, in one aspect, is a substrate for electrically interconnecting individual solar cells in a solar cell array. The substrate includes a dielectric tape that supports the solar cells. The individual solar cells supported on the dielectric tape are electrically interconnected by an electrical circuit that includes a plurality of contact fingers, the electrical circuit is supported by the dielectric tape. The contact fingers have a portion of both sides substantially free of the dielectric tape. The dielectric tape includes a plurality of primary openings, one primary opening being associated with at least one contact finger and positioned so that the contact finger can be directed toward, and electrically connected to, the solar cells. The primary openings provide a simple, yet effective feature that allows the contact fingers of the electrical circuit to be electrically connected to the solar cells. When the electrical circuit is positioned above or below the dielectric tape, the primary openings allow the contact fingers to be bent upwards in the direction of the solar cell so that the contact fingers can be electrically connected to the solar cells.

In another aspect, the present invention is a method of interconnecting the individual solar cells in a solar cell array by mounting the solar cells on a dielectric tape having a plurality of primary openings. In the context of the present invention, the individual solar cells are electrically interconnected through an electrical circuit that is supported by the dielectric tape below the solar cells. The electrical circuit includes a plurality of contact fingers each associated with one primary opening when the electrical circuit is supported by the dielectric tape. The method involves electrically interconnecting the individual solar cells by bending the contact fingers in the direction of the solar cell so that the contact fingers can be electrically connected to the solar cells.

The present invention also relates to arrays of photovoltaic cells and a method for producing such arrays that incorporate the substrate for electrically interconnecting individual solar cells described above. Arrays formed in accordance with the present invention can include single junction cells, multiple-junction cells, heterojunction cells, monolithic tandem cells, and mechanically stacked tandem cells. The arrays can include upper and lower reflective layers for protecting those portions of the array where the impingement of incident light would have a detrimental effect. The reflective layer can also be provided with a thin film of conductive material that provides a ground plane or charge leakage path for static charge that can build up on the array from the space plasma.

Other objects, features, and advantages of the present invention will be readily apparent from the following description of certain preferred embodiments thereof, taken in conjunction with the accompanying drawings. It is understood that variations and modifications may be effected without departing from the spirit and scope of the novel concepts of the disclosure.

BRIEF DESCRIPTION OF THE DRAWINGS

FIG. 12 is a schematic view of a bus interconnection scheme for an array formed in accordance with the present invention using the mechanically stacked tandem cell of FIG. 9.

DETAILED DESCRIPTION OF THE INVENTION

Figure 1:
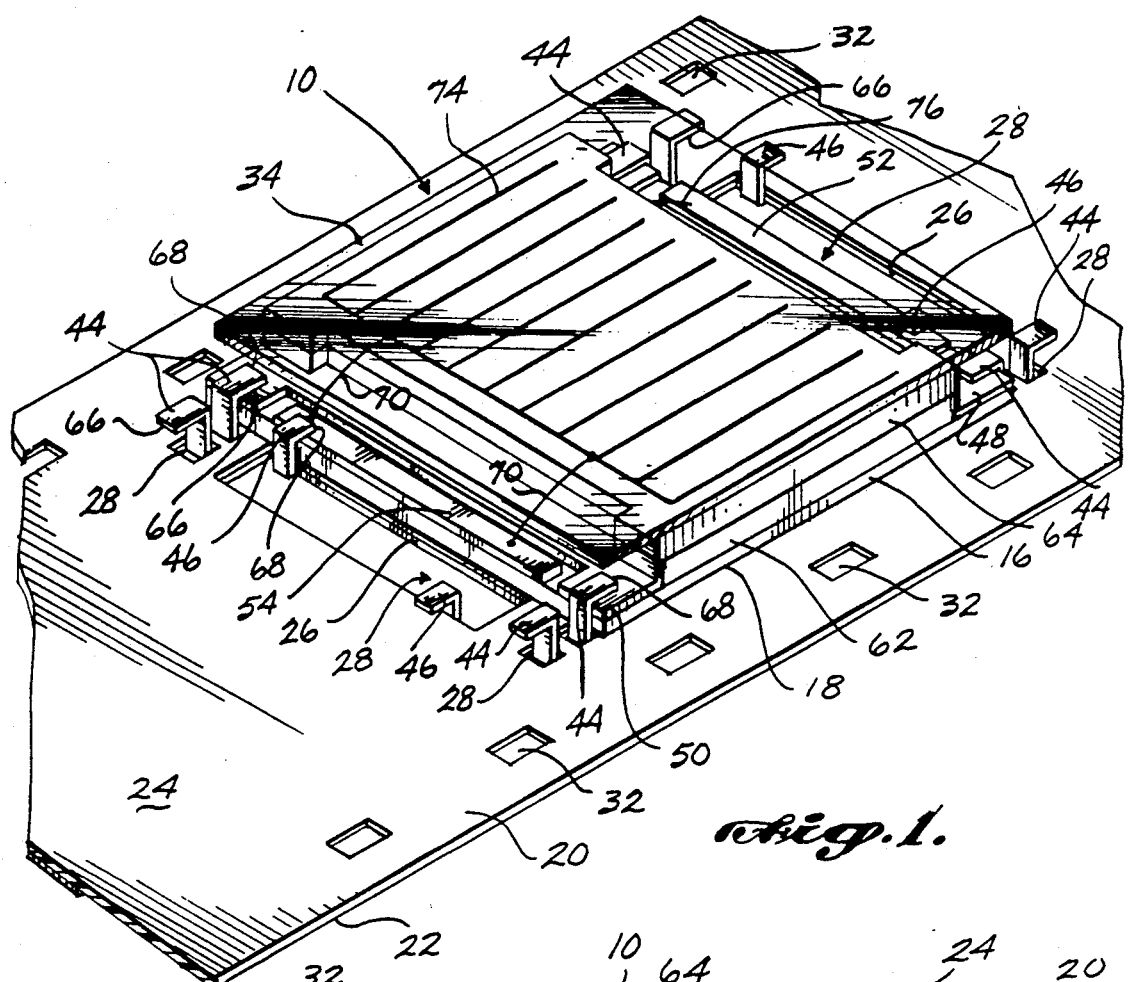
FIG. 1 is an enlarged isometric view of solar cells electrically connected to an interconnect circuit in accordance with the present invention.
Figure 3:
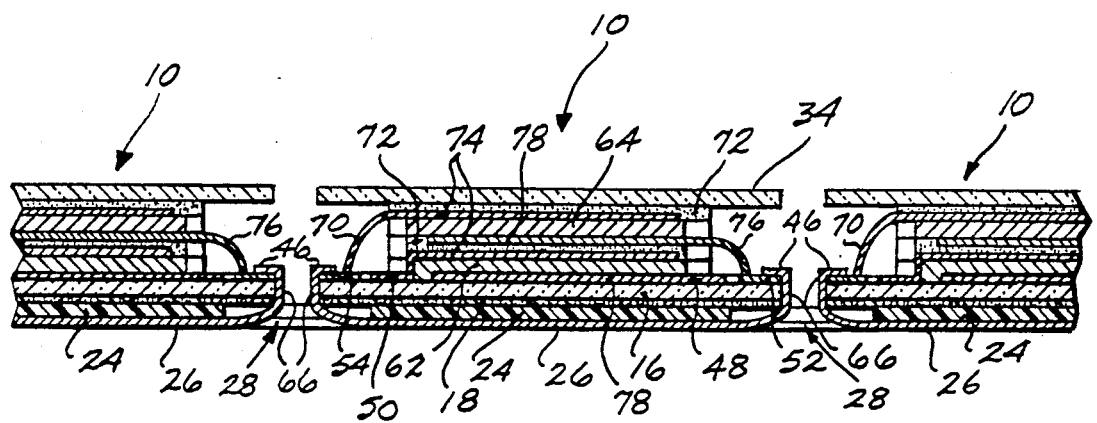
FIG. 3 is an enlarged fragmentary view of a vertical cross section taken through several solar cells electrically connected to an interconnect circuit in accordance with the present invention.
Figure 4:
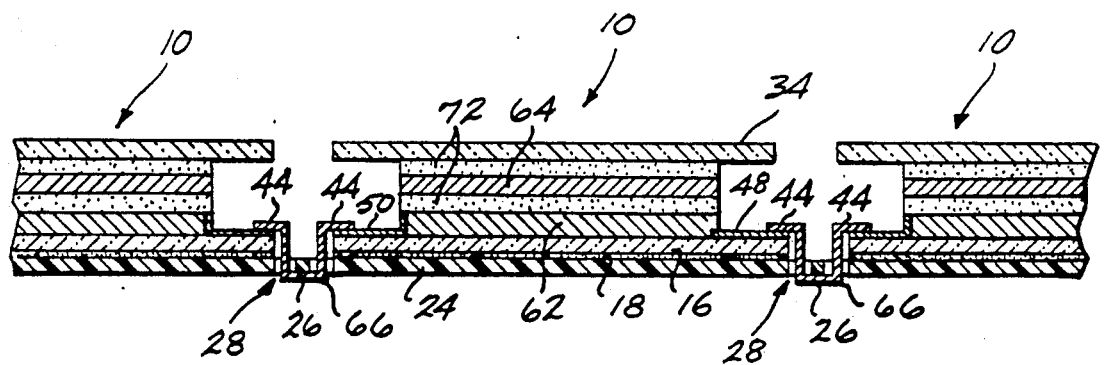
FIG. 4 is an enlarged fragmentary view of a vertical cross section taken through several solar cells electrically connected to an interconnect circuit in accordance with the present invention.

Referring now to the drawings, wherein like reference characters designate like or corresponding parts throughout the several views, in FIGS. 1, 3, and 4, solar cells generally indicated by reference numerals 10 are electrically connected to an underlying electrical circuit indicated by reference numeral 26 through the respective bent elongate contact fingers indicated by reference numerals 46 and 44 that are an integral part of the electrical circuit 26. In FIG. 1, for simplicity, only one solar cell 10 is shown. In FIGS. 3 and 4, one whole solar cell 10 and fragments of two other solar cells 10 are shown. It should be understood that for simplicity, only the components of the whole solar cell 10 have been referenced with numerals, the components of the fragmentary solar cells being identical to the components of the whole solar cell 10.

The solar cell 10 is a tandem type solar cell that includes a lower crystalline photovoltaic solar cell 62 and an upper crystalline photovoltaic solar cell 64. The lower photovoltaic cell 62 includes electrodes corresponding to reference numerals 48 and 50 and the upper photovoltaic cell 64 includes electrodes corresponding to reference numerals 52 and 54. The negative electrode 54 is electrically connected to a negative voltage power buss 74 on top of the upper photovoltaic cell 64 by ribbon connections 70. Likewise, the positive electrode 52 is electrically connected to a positive voltage power buss 78 on the lower surface of the upper photovoltaic cell 64 by ribbon connections 76. It should be understood that the substrate for interconnecting individual solar cells and the method of interconnecting individual solar cells in accordance with the present invention is not limited to tandem design solar cells. Other solar cells including only one semiconductor can also be interconnected in accordance with the present invention.

The electrical circuit 26 is supported by the elongate dielectric tape 24 on an interconnect surface 22 that is on the opposite side of the dielectric tape 24 from a carrier surface indicated by reference numeral 20. The solar cell 10 is attached to the carrier surface 20 by an adhesive layer generally indicated by reference numeral 18 such that the dielectric tape 24 separates the electrical circuit 26 and the adhesive layer 18. The dielectric tape 24 includes a plurality of primary openings indicated by reference numerals 28, one primary opening 28 being associated with at least one contact finger 46 or 44. The primary openings 28 are positioned relative to the contact fingers 46 and 44 such that the contact fingers 46 and 44 can be directed upward in FIGS. 1, 3, and 4, through the primary openings 28 and toward the solar cells 10 so they can make electrical contact with the positive and negative electrodes indicated by reference numerals 48, 50, 52, and 54 of the solar cell 10.

Figure 2:
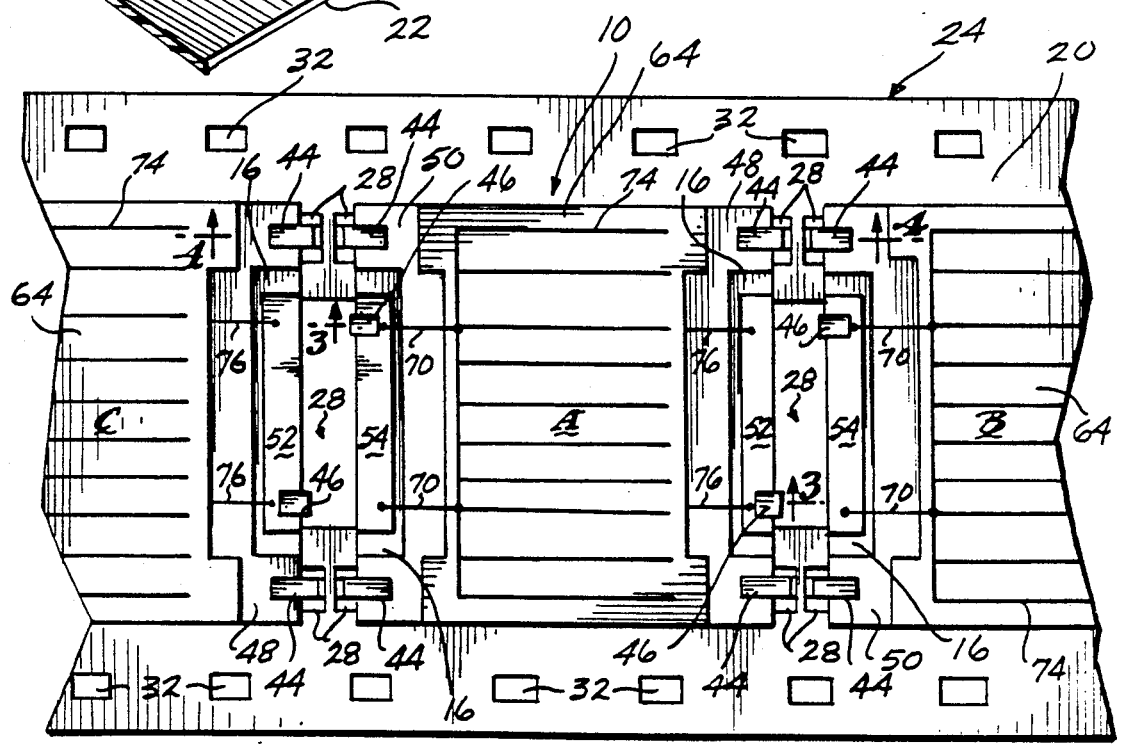
FIG. 2 is an enlarged plan view of the top of a plurality of tandem solar cells electrically interconnected in accordance with the present invention.

Referring to FIG. 2, a top view of the solar cells 10 and dielectric tape 24 illustrated in FIGS. 1, 3, 4, and 8 is shown. The contact fingers 44 in FIG. 2 correspond to the contact fingers 44 in FIGS. 1 and 8. The contact fingers 46 in FIG. 2 correspond to the contact fingers 46 in FIGS. 1, 3, 4, and 8. In FIG. 2, the contact fingers 44 provide direct electrical interconnection between positive electrode 48 of solar cell A and negative electrode 50 of solar cell B. Depending on the particular design of the electrical circuit 26 of which the contact fingers 46 are an integral part, the negative electrode 54 of solar cell A and the negative electrode 54 of solar cell B can be connected in series or in parallel. Likewise, the positive electrode 52 of solar cell A and the positive electrode 52 of solar cell C can be connected in series or in parallel.

As shown in FIG. 2, the primary openings 28 underlying the solar cells A, B, and C are associated with the contact fingers 44 and 46 and positioned so as to allow for the manual or mechanical bending of the contact fingers 44 and 46 upward through the primary opening 28 in the dielectric tape 24 so that the contact fingers 44 and 46 can be electrically connected to the respective electrodes of the solar cells. Although the contact fingers 44 and 46 in FIGS. 1, 3, and 4 are positioned directly beneath the primary openings 28, it is within the context of the present invention that the contact fingers not be directly beneath the primary openings, what is necessary is the primary openings be positioned such that the contact fingers may be directed through the dielectric tape 24 via the primary openings 28. For example, though not shown, the primary openings 28 in FIGS. 1, 3, and 4 may be slightly offset from the position of the contact fingers. The dielectric tape 24 also includes sprocket holes 32 in registered position along the edges of the tape 24. The sprocket holes 32 are evenly spaced and provide a means whereby the dielectric tape 24 can be advanced or reversed in a continuous automated operation.

Figure 8:
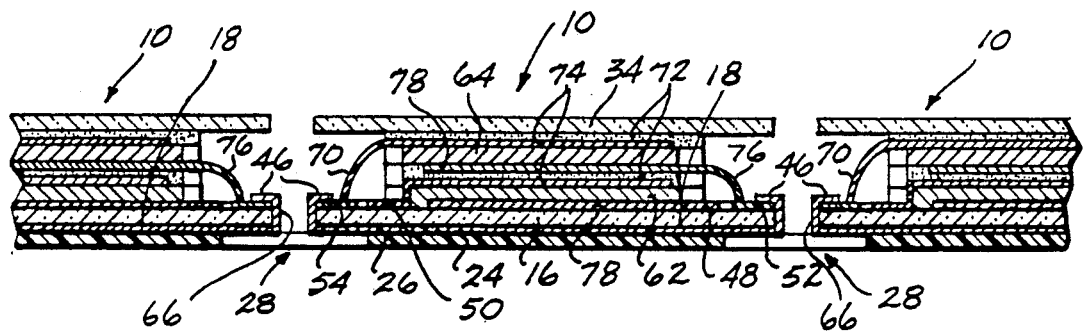
FIG. 8 is an enlarged fragmentary view of a vertical cross section taken through several solar cells electrically interconnected to an interconnect circuit in accordance with the present invention.

In FIG. 8, unlike FIGS. 1, 3, and 4, the electrical circuit 26 is supported by the carrier surface 20 of the dielectric tape 24. The solar cell 10 is attached to the top of the electrical circuit 26 by the adhesive layer 18. In FIG. 8, the dielectric tape 24 does not separate the electrical circuit 26 and the adhesive layer 18; however, as in FIGS. 1, 3, and 4, the electrical circuit 26 in FIG. 8 is below the horizontal plane defined by the solar cell 10. As in FIGS. 1 and 3, the contact fingers 46 are associated with the primary openings 28 in the dielectric tape 24, providing access to the lower surface 66 of the contact fingers 46, thus providing a surface against which force may be exerted in order to bend the contact fingers 46 upward in FIG. 8 so that the contact fingers 46 can be directed toward and electrically connected to the electrodes 48 and 50 of the solar cell 10.

When the electrical circuit 26 is supported on the carrier surface 20 of the dielectric tape 24 as in FIG. 8, the primary openings 28 are not necessary in order to provide openings for the contact fingers to pass upward through the dielectric tape; however, when the electrical circuit 26 is supported on the carrier surface 20, the primary openings 28 provide a means of accessing the lower surface 66 of the contact fingers 46 in FIG. 8, thus allowing the manual or mechanical application of force to the lower surface 66 of the contact fingers 46 so that they may be bent upward and electrically connected to the electrodes 52 and 54 of the solar cells 10 in FIG. 8. Therefore, when the electrical circuit is supported on the carrier surface, at least a portion of the primary openings must be directly beneath the contact fingers in order to provide access to the lower surface of the contact fingers.

Figure 5:
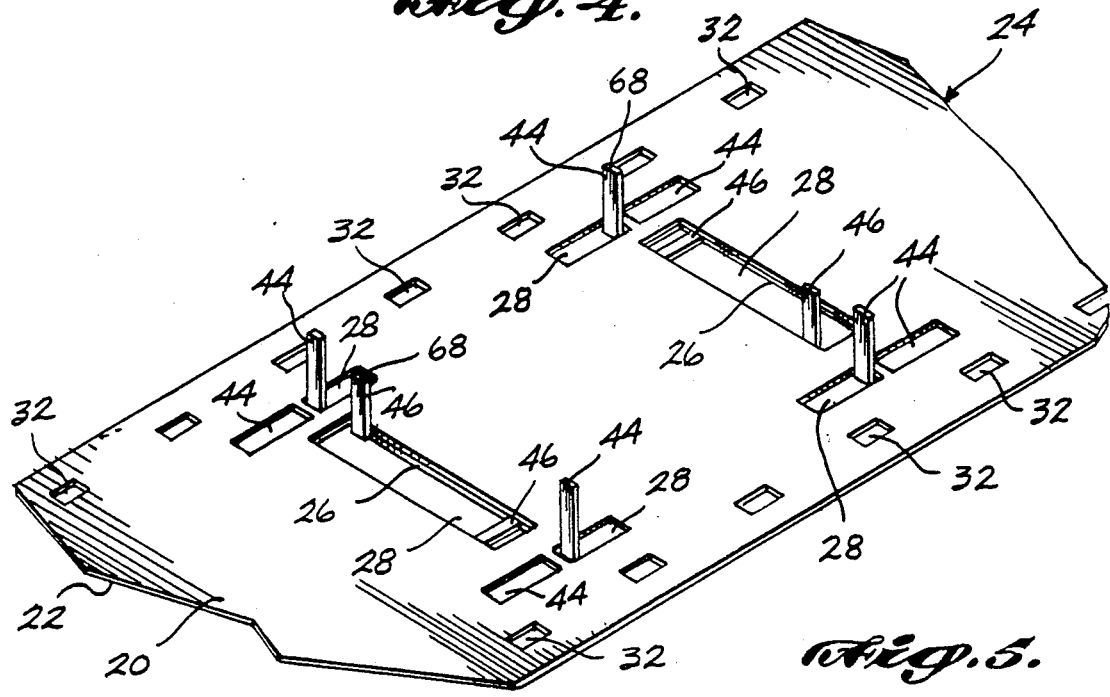
FIG. 5 is an enlarged isometric view of the electrical interconnect substrate in accordance with the present invention.

FIG. 5 corresponds to FIG. 2 with the solar cells A, B, and C removed to show the primary openings 28 that coincide with the contact fingers 44 and 46. Those contact fingers 44 and 46 that are connected to solar cell A in FIGS. 1, 3, and 4, are bent upward in FIG. 5 into a position that will allow the solar cell 10 to be placed between the vertical contact fingers 44 and 46. After the solar cell 10 is in place, the contact fingers 44 and 46 are bent again to make electrical contact with the respective electrodes of the solar cell 10. The size and position of the respective primary openings 28 will be determined by primarily considering the location of the contact fingers 44 and 46 that will ultimately be electrically connected to the electrodes of solar cells 10. When the electrical circuit 26 is supported on the interconnect surface 22 of the dielectric tape 24 opposite the carrier surface 20 upon which the solar cells A, B, and C reside, the size of the primary openings 28 must be such that the terminal ends 68 of the elongate contact fingers 44 and 46 are able to pass freely through the primary openings 28 and dielectric tape 24 so that they may be bent upward towards the solar cells 10 and electrically connected to the electrodes of the solar cells. As can be seen in FIG. 5, both vertical surfaces (primary and secondary surfaces) of contact fingers 44 and 46 are substantially free of the dielectric tape. When a portion of the surfaces of a contact finger is substantially free of the dielectric tape, either surface of the contact finger can be electrically connected to an electrode. In other words, referring to contact finger 44, depending on the position of the electrode to which the contact finger is to be electrically connected, the contact finger can be bent to the right in FIG. 5, or to the left in FIG. 5, and still have a surface that can be directly electrically connected to the electrode. The ability to electrically connect either surface of the contact finger to an electrode provides more versatility with regard to the specific interconnections that can be made for a given electrical circuit. By comparison, when one surface of the contact finger is covered with dielectric tape, the contact finger can be electrically connected to an electrode that is on the same side of the contact finger as the exposed surface as described above; however, in order to electrically connect the contact finger to an electrode on the side of the contact finger that is covered by the dielectric tape, the contact finger must be folded back over itself or twisted in order to position the exposed surface of the contact finger directly adjacent to the electrode so it can be electrically connected to the electrode. By having both surfaces of the contact finger substantially free of the dielectric tape, the tedious task of removing dielectric tape from the small contact finger prior to electrical connection to an electrode or other conductive surface is avoided.

When the electrical circuit 26 is supported on the carrier surface 20 of the dielectric tape 24 as in FIG. 8, it is not necessary that the terminal ends 68 of the contact fingers 44 and 46 be able to pass through the dielectric tape 24 but, rather, the size and position of the primary openings 28 must be such that the contact fingers 44 and 46 can be directed upward from below so that they may be bent and electrically connected to the electrodes of the solar cell that is positioned above the electrical circuit 26. Referring back to FIG. 5, for example, when the electrical circuit 26 is supported by the carrier surface 20, the contact fingers 44 and 46 can bridge the primary opening 28 and still be useful within the context of the present invention. Although primary openings 28 are provided for each contact finger 44 and 46, it is not necessary that each contact finger 44 and 46 be electrically connected to an electrode of the solar cell. In fact, to increase the yield in the production of the solar cell arrays, it may be desirable to provide redundant contact fingers that will be used if the primary contact should prove to be faulty.

The dielectric tape used in accordance with the present invention should be a lightweight, flexible material having a high dielectric constant. The dielectric tape should also be made of a material that can be easily and accurately punctured so that the primary openings can be effectively punched or cut out of the dielectric tape. A preferred material for the dielectric tape is a polyimide tape commercially available with sprocket holes from E. I. duPont de Nemours and Co., 3M, and Rogers, Inc. However, other dielectric materials may be used.

The primary openings in the dielectric tape are provided by punching holes in the dielectric tape using conventional techniques employing male and female dies or by cutting the primary openings out of dielectric tape with a sharp blade. An alternative to punching or cutting the holes involves chemically etching the holes into the polyimide tape. Because of the repeating nature of the contact fingers of the electrical circuit and the associated primary openings, the punching of the primary openings in the dielectric tape is adaptable to automation, taking advantage of the sprocket holes. Punching of the primary openings in the dielectric tape is preferred to cutting the openings out of the dielectric tape, especially when the electrical circuits are attached to the dielectric tape after, rather than before, the primary openings have been punched out of the dielectric tape.

Figure 6:
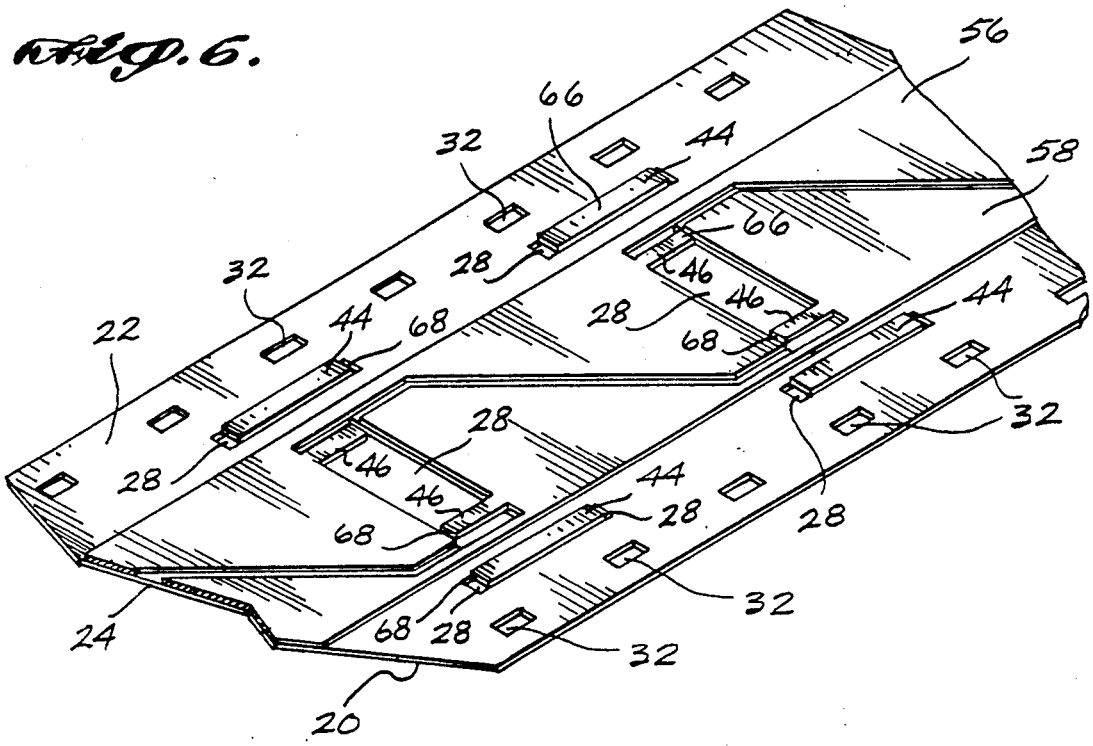
FIG. 6 is an enlarged plan view of the bottom of the electrical interconnect substrate of FIG. 5.

Referring to FIG. 6, an exemplary electrical circuit corresponding to the pattern of contact fingers 46 and 44 shown in FIGS. 1, 2 and 5, is supported on the interconnect surface 22 and includes repeating elongate contact fingers 44 that will provide direct electrical interconnection between electrodes of adjacent solar cells and two electrical circuits 56 and 58 that are connected to contact fingers 46. Each of the circuits 56 and 58 are electrically independent from each other and are segmented from one another and include their own set of repeating contact fingers 46. It should be understood that the electrical circuit including contact fingers 44 and the electrical circuits 56 and 58 illustrated in FIG. 6 are exemplary, and other circuits would be equally applicable in the present invention so long as the position of the contact fingers 44 and 46 are associated with the position of the primary openings 28 in the dielectric tape 24 allowing for the bending of the respective contact fingers toward the solar cell so that the electrical circuit, through the contact fingers, can be electrically connected to the electrodes of the solar cells. The particular design of the interconnect electrical circuit will be determined by primarily taking into consideration the series and parallel connections needed to optimize voltage matching or impedance matching, as well as the contact pad (electrode) pattern and location for the particular solar cells.

In the context of the present invention, the electrical circuit can be supported on the surfaces of the dielectric tape in several ways. For example, the electrical circuit can be supported on the interconnect surface by laminating it between the interconnect surface and an adhesive dielectric tape onto which the electrical circuit has been deposited. Alternatively, the electrical circuit can be deposited directly onto the interconnect surface or the carrier surface of the dielectric tape by conventional means, such as depositing and photolithographically patterning the circuitry onto the dielectric tape. If the electrical circuit is supported on the dielectric tape before the primary openings are made in the dielectric tape, cutting the openings out of the tape, rather than punching the openings in the tape, should be used to make the primary openings so that the electrical circuit is not damaged.

To electrically connect the electrical circuit to the electrodes of the solar cells, the contact fingers must be directed or bent toward the solar cells. The contact fingers can be bent or directed toward the solar cells by pushing on the lower surface (66 in FIGS. 1, 3, 4, 6, and 8) of the contact fingers 44 and 46. The force exerted on the contact fingers 44 and 46 should be sufficient to bend the fingers toward the primary openings and the electrodes of the solar cell without tearing or delaminating the contact fingers or electrical circuit from the supporting surface of the dielectric tape. For those electrical circuits supported on the interconnect surface of the dielectric tape, when the contact fingers are not directly beneath the primary openings, the contact fingers must be bent towards the primary opening prior to bending the contact fingers through the openings. The contact fingers must be long enough so that when bent towards the solar cell, the fingers can be electrically connected to the electrodes of the solar cell. Generally, the length of the elongate contact fingers will be between about 0.3 mm and 1.0 mm. It is preferred that the contact fingers be long enough so they can be electrically connected to the upper surface of the solar cell. By connecting the contact fingers to the electrodes on the upper surface of the solar cells, the need for the redundant wrap-around contacts and additional processing steps to provide connection to an electrode below the substrate of the solar cell is avoided. The contact fingers can be electrically connected to the electrodes of the solar cells by conventional means such as soldering, laser bonding, thermal compression, gap welding, or other means that can provide direct electrical connection between the contact fingers and the electrodes of the solar cells.

After the electrodes of the solar cells have been electrically connected to the contact fingers as described above, the dielectric tape, including the sprocket holes, should be trimmed to as small a dimension as possible without damaging the solar cells or underlying electrical circuitry. This is particularly true when the solar cell array is to be used in space applications where weight is a prime consideration. Even in terrestrial applications where weight is not such a major concern, the sprocket holes should be trimmed in order to maximize the packing of the individual strips of solar cell arrays.

Figure 7:
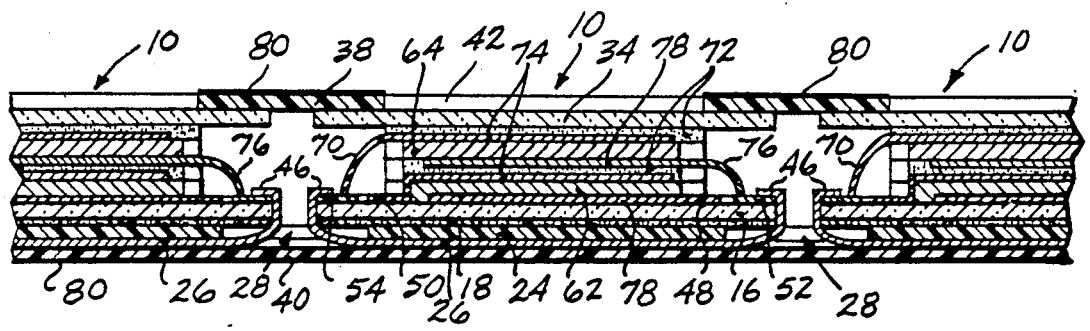
FIG. 7 is an enlarged elevational view of a fragment of a solar cell array having several individual solar cells that are electrically interconnected in accordance with the present invention.

Referring now to FIGS. 3 and 7, solar cells 10 usable in the present invention include an upper photovoltaic cell 64 and a lower photovoltaic cell 62 that in combination are known as a tandem solar cell. The tandem solar cells include a glass substrate 16 upon which resides the positive electrode 48 and a portion of the negative electrode 50 of the lower photovoltaic cell 62. The portion of the negative electrode 50 of the lower photovoltaic cell 62 that does not reside on the glass substrate 16, rests on the upper surface of the lower cell 62 where it is electrically connected to a negative voltage power buss 74. The positive electrode is electrically connected to a positive voltage power buss 78 on the lower surface of the lower cell 62. On top of the negative voltage power buss 74 that resides on the upper surface of the lower photovoltaic cell 62 is a transparent adhesive layer 72 that bonds the upper photovoltaic cell 64 including its positive voltage power buss 78 and its negative voltage power buss 74 to the upper surface of the lower photovoltaic cell 62. On top of the upper photovoltaic cell 64 is another transparent layer of adhesive 72 that secures a cover glass 34 to the upper surface of the upper photovoltaic cell 64. A ribbon connection 70 is provided between the negative electrode 54 and the negative voltage power buss 74 of the upper photovoltaic cell 64. In a similar fashion, the positive electrode 48 and the positive voltage power buss 78 of the upper photovoltaic cell 64 are electrically connected. Although the particular semiconductors that make up the photovoltaic cells are not critical to the present invention, an exemplary tandem solar cell includes a Gallium-Arsenide (GaAs) crystalline semiconductor as the upper photovoltaic cell 64 and a Copper-Indium-Selenide (CIS) crystalline semiconductor as the lower photovoltaic cell 62. Thin silicon semiconductors and II-VI semiconductors can also be used in an array formed in accordance with the present invention.

Photovoltaic cells that are useful in an array formed in accordance with the present invention generally include semiconductors that are fragile and break easily as a result of their brittle nature and the thin structure that is required in order to decrease the weight of the photovoltaic cell and increase the specific power output of the cells. The semiconductors in such cells range in thickness between about 1.0 microns and about 100 microns. Preferably, the semiconductors are less than about 10 microns thick. Examples of photovoltaic cells that can be used to form an array in accordance with the present invention are described in U.S. Pat. Nos. 4,795,501; 4,680,422; 4,703,131; 4,684,761; 4,523,051; Re. 31,968; 4,227,941; and 4,547,622 the disclosures of which are incorporated herein by reference. Such photovoltaic cells include single junction cells, heterojunction cells, monolithic tandem cells, and mechanically stacked tandem cells. One example of a particular mechanically stacked tandem cell useful in an array formed in accordance with the present invention includes a III-V/I-III-VI$_2$ semiconductor type cell such as (AlGaAs) GaAs/CIS mechanically stacked tandem photovoltaic cell described below. A (AlGaAs)GaAs/CIS tandem cell is lightweight and highly efficient in converting solar flux to electrical energy. Such cells have a mass per surface area of less than about 60 milligrams per square centimeter, although cells having greater ratios of mass to surface area can be used.

Figure 9:
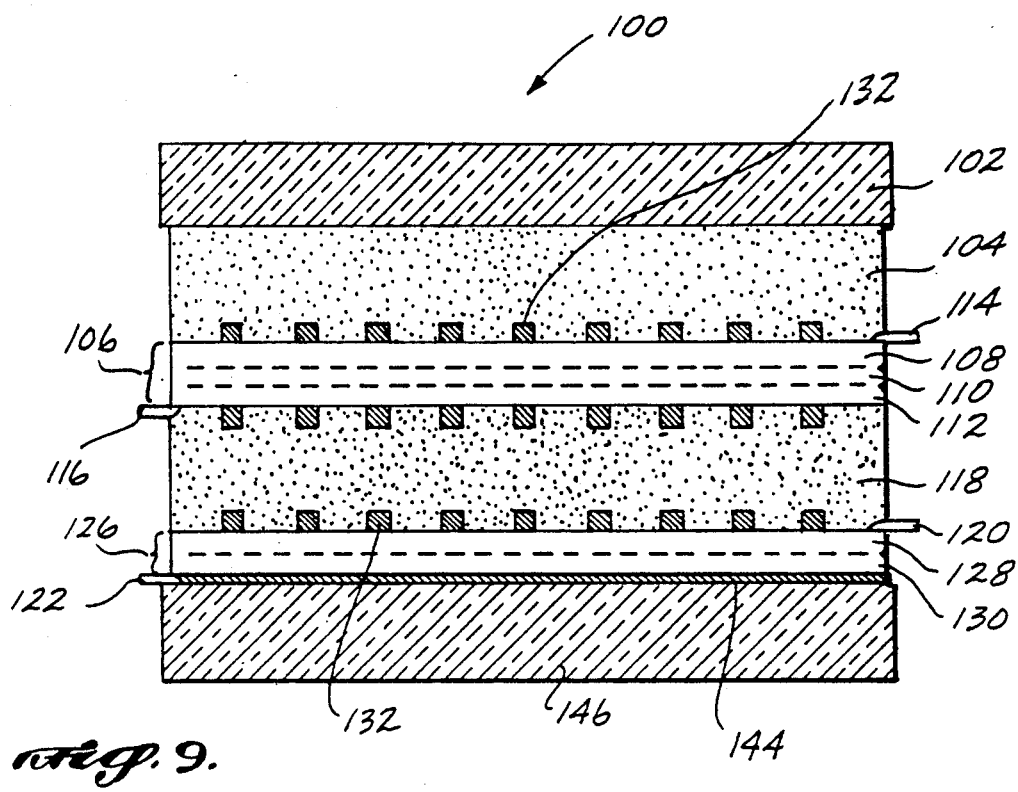
FIG. 9 is a schematic side view of a vertical cross section through a preferred mechanically stacked tandem solar cell useful in forming an array in accordance with the present invention.
Figure 10:
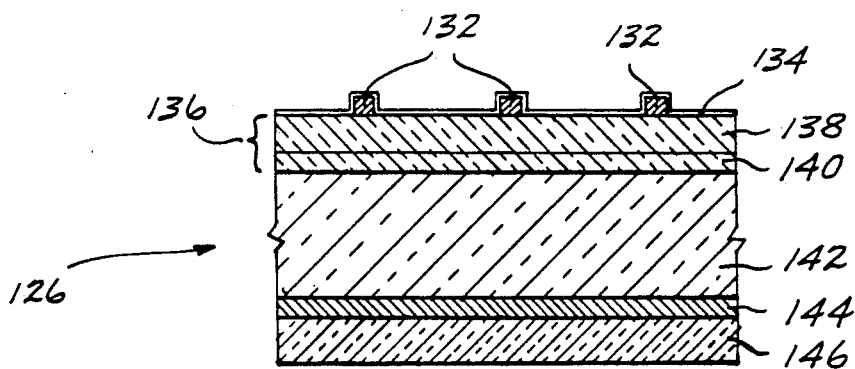
FIG. 10 is a schematic side view of a vertical cross section through the upper subcell in the mechanically stacked tandem cell of FIG. 9.

Referring to FIG. 9, a (AlGaAs)GaAs/CuInSe$_2$ mechanically stacked tandem cell consists of a double heterostructure (AlGaAs)GaAs CLEFT (Cleavage of Lateral Epitaxial Film For Transfer) thin-film top cell 106 and a polycrystalline CuInSe$_2$(CIS) thin-film heterojunction lower cell 126. Referring to FIG. 10, the bottom CIS subcell 126 includes glass substrate 146, which ranges in thickness from about 50 to about 460 micrometers. To minimize the weight of the individual photovoltaic cell, it is preferred to use a glass substrate having a thickness in the lower end of the above range. On top of glass substrate 146 is a molybdenum(Mo)-back electrode 144 having a thickness ranging between about 1 to about 2 micrometers. Above back electrode 144 is a CIS absorber layer 142 having a thickness ranging from about 2.5 micrometers to about 3 micrometers. Above CIS absorber layer 142 is a cadmium zinc sulfide (CdZnS) window layer 136 having a thickness ranging from about 2.5 to about 4 micrometers. Cadmium zinc sulfide window layer 136 includes a lower portion 140 having a thickness ranging from about 0.5 to 1 micrometer that comprises cadmium zinc sulfide. The upper portion of the cadmium zinc sulfide window layer 136 includes a layer 138 having a thickness ranging from about 2 to 3 micrometers that comprises indium-doped cadmium zinc sulfide. Grid contacts 132 of a metallic material, such as aluminum, are supported on top of window layer 136. The top of CIS subcell 126 is coated with an antireflective coating 134 that serves to minimize the reflection of incident light that impinges on the upper surface of CIS subcell 126. The antireflection coating may be successive layers of transparent materials having relatively high and relatively low indices of refraction, respectively. Examples of materials suitable for antireflection coating 134 include silicon nitride, a double layer of SiN/Al₂O₃, or a coating prepared by electron beam evaporation of titanium dioxide and aluminum oxide.

The bottom CIS cell can be fabricated by sequential deposition of a molybdenum-back electrode 144, CIS absorber layer 142, and cadmium zinc sulfide window layer 136, followed by photolithographic patterning and etching to define the size and shape of the semiconductors. Grid contacts 132 and antireflection coating 134 are then added by conventional techniques described briefly below to complete fabrication of an n-on-p CIS cell.

The molybdenum-back electrode can be deposited by DC magnetron sputtering followed by photolithographic patterning to define the electrode boundary. The CIS and cadmium zinc sulfide window layers can be deposited by co-evaporation techniques followed by conventional photolithographic patterning to define the cell areas. The metallic contact grid can be deposited by electron gun evaporation techniques and the antireflective coating can be deposited by a PECVD (Plasma Enhanced Chemical Vapor Deposition) technique. The electrodes 52 and 54 on glass substrate 16 in FIG. 1 for interconnection of the top cell electrodes and subarray string can be formed during the fabrication of the CIS cell when the electrodes 48 and 50 in FIG. 1, for the CIS cell are formed. Additional details of the fabrication process briefly described above may be found in Stanbery, B. J. et al., "Thin Film Tandem GaAs/CuInSe₂ Solar Cells For Space Power Applications," *Conference Record 19th IEEE Photovoltaic Specialist Conference*, p. 280–284, 1987; Kim, N. P. et al., "High Efficiency GaAs/CuInSe₂ Tandem Junction Solar Cells," *Conference Record 20th IEEE Photovoltaic Specialist Conference*, p. 457–461, 1988; Mickelsen, R. A. et al., "Polycrystalline Thin Film CuInSe₂ Solar Cells," *Conference Record 16th IEEE Photovoltaic Specialist Conference*, pp. 781–785, 1982, each of which is incorporated herein by reference.

Figure 11:
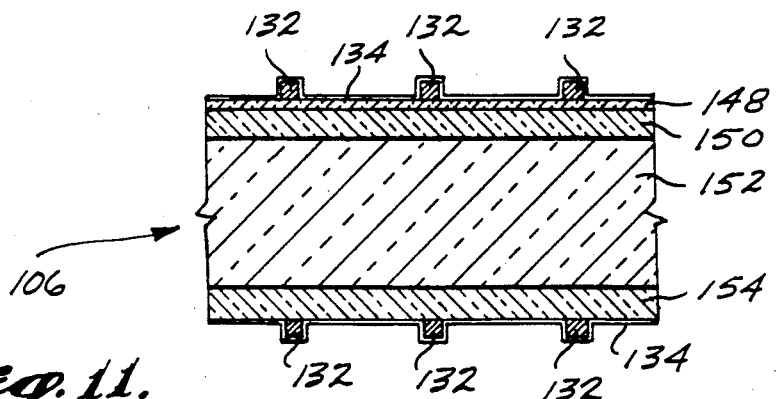
FIG. 11 is a schematic side view of a vertical cross section through the lower subcell in the mechanically stacked tandem cell of FIG. 9.

Referring to FIG. 11, upper (AlGaAs)GaAs subcell 106 includes p+AlGaAs BSF (Back Surface Field) layer 154 having a thickness ranging between about 0.1 micrometers and 1.0 micrometers, pGaAs base layer 152 having a thickness ranging between about 1.0 micrometers and 5.0 micrometers, nGaAs emitter layer 150 having a thickness ranging between about 0.1 micrometers and about 0.5 micrometers and n+AlGaAs window layer 148. Such cells have been described by Gale. Though not shown, between top of window layer 148 and the bottom of conductive grid contacts 132 is a n+GaAs cap layer. Covering the top of cell 106 is an antireflection coating layer 134 comprising antireflective materials similar to those described above with reference to the CIS subcell. Supported on the bottom of BSF layer 154 are grid contacts 132 with antireflection layer 134 deposited over grid contacts 132 and BSF layer 154 as described above.

Fabrication of the top (AlGaAs)GaAs thin-film subcell 106 by a CLEFT process has been described by McClelland, R. W. et al. "A Technique For Producing Epitaxial Films On Reusable Substrates," *Applied Physics Letter*, Vol. 37, No. 6, Sept. 15, 1980, p. 560–562; Gale, R. P. et al., "High Efficiency Thin-Film AlGaAs-GaAs Double Heterostructure Solar Cells," *Conference Record 20th IEEE Photovoltaic Specialist Conference*, p. 446–450, 1988; and in U.S. Pat. No. 4,837,182 to Bozler et al., each of which are incorporated herein by reference. Briefly, the (AlGaAs)GaAs thin-film cell 106 is fabricated by growing a thin-film layer on a bulk GaAs substrate through seed lines using a vapor phase epitaxy method. The double heterostructure n-on-p cell can be formed by sequential growth of the pGaAs buffer layer (not shown), p+AlGaAs BSF layer 154, pGaAs base layer 152, nGaAs emitter layer 150, n+AlGaAs window layer 148 and n+GaAs cap layer (not shown). Additional description of the growth parameters can be found in Gale, R. P. et al. "High Efficiency Double Heterostructure AlGaAs/GaAs Solar Cells," *Conference Record 18th IEEE Photovoltaic Specialist Conference*, p. 296–299, 1985, which is incorporated herein by reference. After cell growth is completed, the front grid contact metallization and the temporary support mounting are completed and the thin film cleaved from the substrate. After cleaving, the cleaved surface of the deposited cell can then be provided with metallic grid contacts 132 by conventional metallization techniques. The cap layer can be removed by etching, followed by deposition of an antireflective coating layer 132 as described above.

Once fabrication of the top (AlGaAs)GaAs cell 106 and the bottom CIS cell 126 is completed, the two structures will be bonded together using a space-qualified adhesive. Examples of space-qualified adhesives include DC 93-500 available from the Dow Corning Corporation. Referring back to FIG. 9, adhesive layer 118 that bonds the upper subcell 106 to the lower subcell 126 can be about 50 microns thick.

After upper subcell 106 is bonded to lower subcell 126, the tandem photovoltaic cell 100 is attached to carrier surface 20 of a dielectric tape described above using the conventional space-qualified adhesives described above or other space-qualified adhesion techniques.

Either before or after attachment of the tandem photovoltaic cells to the dielectric tape, a coverglass 102 in FIG. 9 can be attached to the top of tandem cell 100 using a layer of adhesive 104. The adhesive used in layer 104 can be the same as the adhesive used to bond upper subcell 106 to lower subcell 126. Generally, the layer of adhesive 104 has a thickness of about 50 micrometers. Referring to FIG. 9, the coverglass can generally be about 50 micrometers thick, although other thicknesses can be used.

The exemplary solar cell 10 illustrated in FIGS. 1, 3, 4 and 7 has electrodes 48, 50, 52 and 54 whose surface available for electrical connection to the electrical circuit resides only on the upper surface of the glass substrate 16, the lower surface of the solar cell 10 is free of electrodes. This is in contrast to other types of solar cells that employ conventional "wrap-around" electrical contacts or electrodes that provide a continuous layer of conductive material from the top of the glass substrate, around the edge of the glass substrate, to the bottom of the glass substrate 16 in FIGS. 1, 3, 4, and 7. When employing solar cells similar to those illustrated in FIGS. 1, 3, 4, and 7, the electrical connection to the electrodes must be made on the upper surface of the solar cell. The solar cells employing the "wrap-around" contacts suffer from the disadvantage that the additional metal needed to provide the "wrap-around" contacts to the bottom of the solar cell increases the mass of each individual solar cell as well as the mass of the entire solar cell array.

Referring to FIG. 7, the solar cells 10, after being attached to the carrier surface 20 of the dielectric tape 24, are electrically interconnected by bending the contact fingers 46 upward through the primary openings 28 in the dielectric tape 24, and electrically connecting the contact fingers 46 to the electrodes 54 and 52 of the solar cell 10. As discussed above, the cover glass 34 can be applied to the top of the solar cell 10 after the solar cell 10 is mounted to the dielectric tape 24. However, the cover glass 34 can also be attached to the upper surface of the solar cell 10 prior to mounting the solar cell 10 on the dielectric tape 24. The components of solar cell 10 and the contact fingers 46 can be protected from the environment by providing an upper protective layer 38 above the solar cells 10. The upper protective layer 38 includes apertures 42 coinciding with the position of the cover glass 34 for allowing solar flux to pass through the upper protective layer 38 and impinge onto the semiconductors of the solar cell 10. To provide additional electrical conductive patterns to complement the primary electrical circuit supported on the dielectric tape 24, the upper protective layer 38 can also include an electrical conductive patter one its lower surface. When the cover glass 34 is applied after the solar cell 10 is mounted to the dielectric tape 24, the upper protective layer 38 can be applied after the cover glass 34 is adhered to the solar cell 10, as shown in FIG. 7. However, the upper protective layer 38 can be applied before the cover glass 34 is attached to the solar cell. In either case, the apertures 42 in the upper protective layer 38 must be associated with the cover glass 34 so that the solar flux can pass through the upper protective layer and impinge onto the semiconductors. The maximum dimensions of the apertures should be such that the cover glass 34 can fit closely into the aperture 42, or as shown in FIG. 7, the size of the aperture 42 is less than the size of the cover glass 34 so that the cover glass 34 can be adhered to the lower or upper surface of the protective layer 38. Conventional adhesives, including space approved adhesives for space applications, can be used to adhere the upper protective layer 38 to the cover glass 34.

The upper protective layer 38 can be of the same material as the dielectric tape 24, for instance, a polyimide-based tape or other suitable materials such as reinforced epoxies. The layer should be as lightweight as practical, taking into consideration the protection desired. In space applications, the upper protective layer 38 covers and serves to isolate the delicate contact fingers 44 and 46 and components of the solar cells 10 from atomic oxygen bombardment and the ambient plasma environment of space. This protection can be enhanced by coating the outer surface of the upper protective layer 38 with a thin metallic and/or an inorganic dielectric film 80 to reduce the chemical reactivity, sputtering yield, and increase the emissivity and reflectivity of the upper protective layer 38. Increasing the reflectivity of the upper protective layer generally results in reduced operating temperatures due to an increased reflection of heat. An example of a suitable metallic film includes an aluminum film. An example of a suitable dielectric film includes a silicon dioxide film. It is possible, depending on the environment and protection desired that thin film 80 could include a metallic surface and a surface comprising an inorganic dielectric material. Also, the surface of the metallic film could be anodized to provide additional protection. The benefits of using the upper protective layer 38 are mitigated by the increased costs and manufacturing steps, as well as the increased weight that the upper protective layer 38 adds to the solar cell array.

Along the same lines, when the electrical circuit 26 is deposited directly onto the interconnect surface 22 of the dielectric tape 24 or when it is carried on carrier surface 20, a lower protective layer 40 with optional metallic and/or dielectric coatings can be provided to cover the electrical circuit 26 and isolate it from the ambient conditions. The lower protective layer 40 can be adhered to the electrical circuit 26 and interconnect surface of the dielectric tape 24 using conventional adhesives, including adhesives approved for space applications. To avoid short circuiting electrical circuit 26, the adhesive should be non-conducting or have a resistivity several orders a magnitude greater than the resistivity of the conductive material making up the electrical circuit. In order to provide additional electrical interconnect schemes, the lower protective layer can include an additional secondary electrical circuit for connection to the photovoltaic cells or the primary electrical circuit. Again, the benefits associated with using the lower protective layer 40 are mitigated by the increased costs and manufacturing steps, as well as the weight that the lower protective layer 40 adds to the solar cell array.

To protect the array and the individual photovoltaic cells from damage resulting from electrical interaction between the solar array and the space plasma, the electrical interaction that can result in parasitic plasma current power loss and corona discharge leading to insulation breakdown and arcing must be avoided. One way of preventing the electrical interaction of the array and solar cells with the space plasma is to provide a ground plane for electrically isolating the array voltages from the space plasma environment. The reflective layers described above that are applied to the exposed surfaces of the dielectric tape can serve as ground planes, particularly when the reflective layers comprise metallic materials, such as aluminum. The ground plane provided by the aluminum film can be electrically connected to other components in the array and serve as a charge leakage path to bleed off static charge that builds up on the other components of the array. The coverglass is a specific example of a component of a solar cell array that is susceptible to a static charge buildup. In order to dissipate the static charge buildup on the coverglass, a transparent conducting oxide, such as indium tin oxide, fluorinated tin oxide, or zinc oxide can be applied as a thin film to the exposed surface of the coverglass. Such transparent conducting oxide films can then be electrically connected with the ground plane to provide a electrical path for dissipation of the static charge that builds up on the surface of the coverglass.

Referring back to FIGS. 2 and 5, although not shown, it is possible to punch out or cut-away a portion of the dielectric tape 24 that would be beneath the individual solar cells A, B, and C in order to reduce the weight of the solar cell array. When removing a portion of the dielectric tape 24 underneath the solar cells, enough of the dielectric tape 24 must remain underneath the individual solar cells in order to provide a surface upon which an adhesive 18 can be applied in order to adhere the glass substrate 16 of the solar cells to the dielectric tape 24. Additionally, removing a portion of the dielectric tape 24 underneath the solar cells with help to dissipate the heat that is generated as the solar flux is converted to electrical power by the solar cells. Similarly, if a lower protective layer of a dielectric tape is used, portions of the tape can be removed to improve the ability of the array to dissipate heat.

The adhesive layer used to attach the glass substrate of the solar cell to the dielectric tape, to adhere the upper protective layer to the cover glass, and to adhere the lower protective layer to the electrical circuit and interconnect surface of the dielectric tape can be a conventional adhesive such as silicone-based adhesives, for example, RTV silicone-rubber adhesive available from General Electric Company. The adhesive used to adhere the upper photovoltaic cell to the lower photovoltaic cell and to adhere the cover glass to the upper surface of the solar cell must be optically transparent to the incident solar flux. As described above, the adhesive should also be substantially nonconducting so that it does not short circuit the individual subcells. An example of such an adhesive is DC 93-500, an optically transparent silicone-based adhesive available from the Dow Corning Corporation. The DC 93-500 adhesive and RTV adhesive are considered by the industry to be approved for use in space applications. Any adhesives used in place of the DC 93-500 or RTV adhesive should also be space-approved if the solar cell array is to be used in space applications.

Depending on the particular combination of the components or features listed below that are incorporated into an array of (AlGaAs)GaAs/CIS photovoltaic cells formed in accordance with the present invention as described above the mass of the blanket cell structure (i.e., cells, electrical interconnects, adhesive layers and tape layers) per surface area of the array can range between about 0.54 kilograms/square meter and about 25.0 kilograms/square meter. For solar cell arrays using thin silicon semiconductors, (e.g., 2 mils thick) the mass of the blanket cell structure per surface area of the array can range between about 0.45 kilograms/square meter and about 20.0 kilograms/square meter. Preferably, the mass of the blanket cell structure per surface area of the array is near the low end of the ranges recited above, e.g., 0.4–0.6 kilograms/square meter. Such values do not include associated structures necessary to deploy and support the blanket cell structure. For either type of cell, the components that will affect the mass of the blanket cell structure per surface area depending on their presence or absence include:

Components

1. Upper protective layers;
2. Lower protective layers;
3. Antireflective layer on upper and/or lower protective layer;
4. Holes cut into tape below cells;
5. Secondary electrical circuit on lower protective layer; and
6. Adhesive for additional layers.

The upper end of the ranges described above depend in part on the mass of the structure required to deploy and support the blanket cell structure. As the mass of the blanket cell structure increases, vibration and oscillation of the blanket cell structure also increases. In order to protect the blanket cell structure from damage resulting from the increased vibrations and oscillations, the support structure must be made stronger and more rigid which normally translates into an increased mass of the support structure. In fact, the mass of the support structure necessary to adequately protect and support a blanket cell structure is approximately related to the square of the mass of the blanket cell structure.

One possible module circuit for a solar cell array formed in accordance with the present invention includes a voltage matched circuit based on three (AlGaAs)GaAs cells in parallel and three CIS cells in series. Referring to FIG. 12, a schematic of this module string includes mechanically stacked tandem cells A–G that include negative electrodes 114 and positive electrodes 116 for upper (AlGaAs)GaAs subcells, and negative electrodes 120 and positive electrodes 122 for the CIS lower subcells. The CIS subcells are electrically interconnected in a series string subcircuit generally indicated by reference numeral 160. The (AlGaAs)GaAs subcells of tandem photovoltaic cells A, B and C and tandem photovoltaic cells D, E, and F are electrically connected in parallel by (AlGaAs)GaAs bus positive cell contacts generally indicated by reference numeral 158 and (AlGaAs)GaAs bus negative cell contacts generally indicated by reference numeral 156. It should be understood that the interconnect circuit configuration of FIG. 12 is based on a voltage matched module; however, other circuit configurations could also be used. In the context of the present invention, the voltage matched modules provide photovoltaic cell arrays that are less susceptible to radiation degradation and changes in operating temperatures.

One of ordinary skill, after reading the foregoing specification, will be able to effect various changes, substitutions of equivalents, and other alterations without departing from the broad concepts disclosed herein. For instance, numerous designs of electrical circuitry may be employed in the context of the present invention, as well as numerous types of individual solar cells. Also, the present invention is equally applicable to solar cell arrays that are to be used in both the terrestrial and space environments. It is therefore intended that the scope of Letters Patent granted hereon will be limited only by the definition contained in the appended claims and equivalents thereof.

The embodiments of the invention in which an exclusive property or privilege is claimed are defined as follows:

1. An array of photovoltaic cells comprising:
   (a) a plurality of photovoltaic cells having a ratio of mass to surface area of less than 60 milligrams/square centimeter;
   (b) a dielectric tape having a carrier surface for supporting said photovoltaic cells;
   (c) interconnect means including an electrical circuit for electrically interconnecting said photovoltaic cells, said interconnect means supported by said dielectric tape on said carrier surface, said electrical circuit including a plurality of contact fingers; and
   (d) means defining a plurality of primary openings in said dielectric tape, a primary opening being associated with a contact finger and positioned such that said contact finger can be directed from below said carrier surface in the direction of said photovoltaic cells and electrically connected to a photovoltaic cell, a portion of both sides of said contact finger being substantially free of said dielectric tape.

2. The array of claim 1, wherein a blanket cell structure of said array has a mass per surface area of the array ranging between about 0.4 kilograms/square meter and about 25.0 kilograms/square meter.

3. The array of claim 1, wherein said photovoltaic cells comprise a thin film cell.

4. The array of claim 3, wherein said photovoltaic cells include a thin film heterojunction.

5. The array of claim 3, wherein said photovoltaic cells include a thin film double heterostructure.

6. The array of claim 3, wherein said thin film cell includes a semiconductor less than about 10 microns thick.

7. The array of claim 1, wherein said photovoltaic cells are tandem cells including an upper subcell and a lower subcell.

8. The array of claim 7, wherein said upper subcell comprises a III-V semiconductor.

9. The array of claim 8, wherein said upper subcell comprises a double heterostructure (AlGaAs)GaAs thin film semiconductor.

10. The array of claim 7, wherein said lower subcell comprises a I-III-$VI_2$ semiconductor.

11. The array of claim 10, wherein said lower subcell includes a semiconductor selected from the group of thin film semiconductor heterojunctions consisting of $CuInSe_2$ and $CuInGaSe_2$.

12. The array of claim 7, wherein said lower subcell comprises a II-VI semiconductor.

13. The array of claim 1, further comprising:
(e) an upper protective layer positioned in a plane above said carrier surface and said photovoltaic cells, said upper protective layer including openings for allowing incident light to impinge on said photovoltaic cells, said upper protective layer serving to isolate said interconnect means and said contact finger from adverse environmental conditions.

14. The array of claim 13, wherein said upper protective layer includes a protective film of an inorganic dielectric material.

15. The array of claim 14, wherein said upper protective layer includes a protective film of a metallic material capable of serving as an electrical ground plane.

16. The array of claim 1, further comprising:
(e) a lower protective layer positioned in a plane below said dielectric tape and said photovoltaic cells, said lower protective layer serving to isolate said interconnect means and said contact fingers from adverse environmental conditions.

17. The array of claim 16, wherein said lower protective layer includes a protective film of an inorganic dielectric film.

18. The array of claim 17, wherein said lower protective layer includes a protective film of a metallic material that serves as an electrical ground plane.

19. An array of photovoltaic cells comprising:
(a) a plurality of photovoltaic cells having a ratio of mass to surface area of less than about 60 milligrams/square centimeter;
(b) a dielectric tape having a carrier surface for supporting said photovoltaic cells and an interconnect surface, said carrier surface and said interconnect surface being on opposite sides of said dielectric tape;
(c) interconnect means including an electrical circuit for electrically interconnecting said photovoltaic cells, said interconnect means supported by said interconnect surface, said electrical circuit including a plurality of contact fingers; and
(d) means defining a plurality of primary openings in said dielectric tape, a primary opening being associated with a contact finger and positioned such that said contact finger can be directed through said primary opening and electrically connected to a photovoltaic cell, a portion of both sides of said contact finger being substantially free of said dielectric tape.

20. The array of claim 19, wherein a blanket cell structure of said array has a mass per surface area of the array ranging between about 0.4 kilograms/square meter and about 25.0 kilograms/square meter.

21. The array of claim 19, wherein said photovoltaic cells comprise a thin film cell.

22. The array of claim 21, wherein said photovoltaic cells include a thin film heterojunction.

23. The array of claim 21, wherein said photovoltaic cells include a thin film double heterostructure.

24. The array of claim 21, wherein said thin film cell includes a semiconductor less than about 10 microns thick.

25. The array of claim 19, wherein said photovoltaic cells are tandem cells including an upper subcell and a lower subcell.

26. The array of claim 25, wherein said upper subcell comprises a III-V semiconductor.

27. The array of claim 25, wherein said lower subcell comprises a I-III-$VI_2$ semiconductor.

28. The array of claim 25, wherein said lower subcell comprises a II-VI semiconductor.

29. The array of claim 25, wherein said upper subcell comprises a double heterostructure (AlGaAs)GaAs thin film semiconductor.

30. The array of claim 25, wherein said lower subcell includes a semiconductor selected from the group of thin film semiconductor heterojunctions consisting of $CuInSe_2$ and $CuInGaSe_2$.

31. The array of claim 19, further comprising:
(e) an upper protective layer positioned in a plane above said carrier surface and said photovoltaic cells, said upper protective layer including openings for allowing incident light to impinge on said photovoltaic cells, said upper protective layer serving to isolate said contact finger from adverse environmental conditions.

32. The array of claim 31, wherein said upper protective layer includes a protective film of an inorganic dielectric material.

33. The array of claim 32, wherein said upper protective layer includes a protective film of a metallic material capable of serving an an electrical ground plane.

34. The array of claim 19, further comprising:
(e) a lower protective layer positioned in a plane below said dielectric tape and said photovoltaic cells, said lower protective layer serving to isolate said interconnect means and said contact fingers from adverse environmental conditions.

35. The array of claim 34, wherein said lower protective layer includes a protective film of an inorganic dielectric film.

36. The array of claim 35, wherein said lower protective layer includes a protective film of a metallic material capable of serving as an electrical ground plane.

37. A method for producing a photovoltaic cell package providing processing protection for fragile, thin film photovoltaic cells and providing high specific power for the package, the method comprising the steps:
(a) adhering a plurality of photovoltaic cells to a dielectric tape having a carrier surface for supporting said photovoltaic cells, said photovoltaic cells being high conversion efficiency, high specific power thin film photovoltaic cells that include:
(i) a double heterostructure CLEFT thin film cell; and
(ii) a thin film heterojunction cell;
said dielectric tape including an interconnect means for electrically interconnecting said photovoltaic cells, said interconnect means supported by said dielectric tape on said carrier surface, said electrical circuit including a plurality of contact fingers and a means defining a plurality of primary openings in said dielectric tape, a primary opening being associated with a contact finger;
(b) directing said contact finger from below said carrier surface in the direction of said photovoltaic cells; and
(c) electrically connecting said contact finger to a photovoltaic cell.

38. The method of claim 37, further comprising the step of providing an upper protective layer in a plane above said dielectric tape and said photovoltaic cells to isolate said interconnect means and said contact fingers from adverse environmental conditions.

39. The method of claim 38, further comprising the step of providing a metallic protective film over said upper protective layer.

40. The method of claim 37, further comprising the step of providing a lower protective layer in a plane below said dielectric tape and said photovoltaic cells to isolate said interconnect means and said contact fingers from adverse environmental conditions.

41. The method of claim 40, further comprising the step of providing a metallic protective film over said lower protective layer.

42. A method for producing a photovoltaic cell package providing processing protection for fragile, thin film photovoltaic cells and providing high specific power for the package, the method comprising the steps:
(a) adhering a plurality of photovoltaic cells to a dielectric tape having a carrier surface for supporting said photovoltaic cells and an interconnect surface, said interconnect surface and said carrier surface being on opposite sides of said dielectric tape, said photovoltaic cells being high conversion efficiency, high specific power thin film photovoltaic cells that include:
(i) a double heterostructure CLEFT thin film cell; and
(ii) a thin film heterojunction cell;
said dielectric tape including an interconnect means for electrically interconnecting said photovoltaic cells, said interconnect means supported by said dielectric tape on said interconnect surface, said electrical circuit including a plurality of contact fingers and a means defining a plurality of primary openings in said dielectric tape, a primary opening being associated with a contact finger;
(b) directing said contact finger through said associated primary opening; and
(c) electrically connecting said contact finger to a photovoltaic cell.

43. The method of claim 42, further comprising the step of providing an upper protective layer in a plane above said dielectric tape and said photovoltaic cells to isolate said contact fingers from adverse environmental conditions.

44. The method of claim 43, further comprising the step of providing a metallic protective film over said upper protective layer.

45. The method of claim 42, further comprising the step of providing a lower protective layer in a plane below said dielectric tape and said photovoltaic cells to electrically isolate said interconnect means.

46. The method of claim 45, further comprising the step of providing a metallic protective film over said lower protective layer.

47. An array of photovoltaic cells comprising:
(a) a plurality of photovoltaic cells;
(b) a dielectric tape having a carrier surface for supporting said photovoltaic cells;
(c) interconnect means including an electrical circuit for electrically interconnecting said photovoltaic cells, said interconnect means supported by said dielectric tape on said carrier surface, said electrical circuit including a plurality of contact fingers having a portion of both sides thereof substantially free of said dielectric tape; and
(d) means defining a plurality of primary openings in said dielectric tape, a primary opening being associated with a contact finger and positioned such that said contact finger can be directed from below said carrier surface in the direction of said photovoltaic cells and electrically connected to a photovoltaic cell.

48. An array of photovoltaic cells comprising:
(a) a plurality of photovoltaic cells;
(b) a dielectric tape having a carrier surface for supporting said photovoltaic cells and an interconnect surface, said carrier surface and said interconnect surface being on opposite sides of said dielectric tape;
(c) interconnect means including an electrical circuit for electrically interconnecting said photovoltaic cells, said interconnect means supported by said interconnect surface, said electrical circuit including a plurality of contact fingers having both surfaces thereof substantially free of said dielectric tape; and
(d) means defining a plurality of primary openings in said dielectric tape, a primary opening being associated with a contact finger and positioned such that said contact finger can be directed through said primary opening and electrically connected to a photovoltaic cell.

49. A substrate for electrically interconnecting individual solar cells in a solar cell array comprising:
(a) a dielectric tape having a carrier surface for supporting said solar cells;
(b) interconnect means including an electrical circuit for electrically interconnecting said solar cells, said interconnect means supported by said dielectric tape on said carrier surface said electrical circuit including a plurality of contact fingers, a portion of both sides of said contact fingers being substantially free of said dielectric tape; and
(c) means defining a plurality of primary openings in said dielectric tape, a primary opening being associated with a contact finger and positioned such that said contact finger can be directed from below said carrier surface in the direction of said solar cells and electrically connected to a solar cell.

50. The substrate of claim 49, wherein the dielectric tape comprises a polyimide.

51. The substrate of claim 49, further comprising an upper protective layer including apertures for said solar cells, said upper protective layer covering portions of said contact fingers that are directed through said primary openings in said dielectric tape.

52. The substrate of claim 51, wherein said upper protective layer is coated with a thin film selected from the group consisting of metallic films and inorganic dielectric films.

53. The substrate of claim 51, wherein the upper protective layer comprises a polyimide.

54. The substrate of claim 49, wherein said primary openings are positioned directly beneath said contact fingers.

55. The substrate of claim 49, further comprising secondary openings in said dielectric tape, said secondary openings being directly beneath said solar cells mounted on said dielectric tape.

56. The substrate of claim 49, wherein said dielectric tape includes sprocket holes adapted for moving said dielectric tape during automated production.

57. A substrate for electrically interconnecting individual solar cells in a solar cell array comprising:
(a) a dielectric tape having a carrier surface for supporting said solar cells and an interconnect surface, said carrier surface and said interconnect surface being on opposite sides of said dielectric tape;
(b) interconnect means including an electrical circuit for electrically interconnecting said solar cells, said interconnect means supported by said interconnect surface, said electrical circuit including a plurality of contact fingers, a portion of both sides of said contact fingers being substantially free of said dielectric tape; and
(c) means defining a plurality of primary openings in said dielectric tape, a primary opening being associated with a contact finger and positioned such that said contact finger can be directed through said primary opening and electrically connected to a solar cell.

58. The substrate of claim 57, further comprising a lower protective layer, said lower protective layer covering said electrical circuit.

59. The substrate of claim 58, wherein said lower protective layer comprises a polyimide.

60. The substrate of claim 58, wherein said lower protective layer further comprises an electrical circuit.

61. The substrate of claim 57, further comprising an upper protective layer including apertures for said solar cells, said upper protective layer covering portions of said contact fingers that are directed through said primary openings in said dielectric tape.

62. The substrate of claim 60, wherein the upper protective layer comprises a polyimide.

63. The substrate of claim 60, wherein said upper protective layer is coated with a thin film selected from the group consisting of metallic films and inorganic dielectric films.

64. The substrate of claim 57, wherein said dielectric tape includes sprocket holes adapted for moving said dielectric tape during automated production.

65. The substrate of claim 57, wherein said interconnect means is located on said interconnect surface.

66. The substrate of claim 57, wherein further comprising secondary openings in said dielectric tape, said secondary openings being directly beneath said solar cells mounted on said dielectric tape.

67. The substrate of claim 57, wherein said primary openings are directly above said contact fingers.

68. In a method of interconnecting individual solar cells of a solar cell array, the improvement comprising:
(a) mounting said solar cells having an upper surface on an elongate dielectric tape having a carrier surface, said solar cells being mounted on said carrier surface, said dielectric tape including a plurality of primary openings;
(b) interconnecting said solar cells through an electrical circuit, said electrical circuit being supported by said carrier surface below said solar cells, said electrical circuit including a plurality of contact fingers, a portion of both sides of said contact fingers being substantially free of said dielectric tape, a primary opening being associated with a contact finger and positioned such that said contact finger can be directed from below said carrier surface in the direction of said solar cells; and
(c) electrically connecting said contact finger to a solar cell.

69. The method of claim 68, wherein said primary openings allow said contact fingers to be directed upward from below said carrier surface and electrically connected to said upper surface of said solar cells.

70. In a method of interconnecting individual solar cells of a solar cell array, the improvement comprising:
(a) mounting said solar cells on an elongate dielectric tape having a carrier surface and an interconnect surface, said carrier surface and said interconnect surface being on opposite sides of said dielectric tape, said solar cells being mounted on said carrier surface, said dielectric tape including a plurality of primary openings;
(b) interconnecting said solar cells through an electrical circuit supported by said interconnect surface, said electrical circuit including a plurality of contact fingers, a portion of both sides of said contact fingers being substantially free of said dielectric tape, a primary opening being associated with a contact finger and positioned such that said contact finger can be directed through said primary opening; and
(c) electrically connecting said contact finger to a solar cell.

71. The method of claim 70, wherein said solar cells include an upper and a lower surface, said lower surface being on the reverse side of said upper surface, said lower surface being adjacent said carrier surface when said solar cells are mounted on said carrier surface, said contact fingers being electrically connected to said upper surface.

72. A photovoltaic cell package providing processing protection for fragile, thin film photovoltaic cells and providing high specific power for the package, the invention comprising:
(a) a plurality of high conversion efficiency, high specific power thin film photovoltaic cells, including:
(i) a double heterostructure CLEFT thin film cell; and
(ii) a thin film heterojunction cell;
(b) a dielectric tape having a carrier surface for supporting said photovoltaic cells;
(c) an interconnect means including an electrical circuit for electrically interconnecting said photovoltaic cells, said interconnect means supported by said dielectric tape on said carrier surface, said electrical circuit including a plurality of contact fingers; and (d) means defining a plurality of primary openings in said dielectric tape, a primary opening being associated with a contact finger and positioned such that said contact finger can be directed from below said carrier surface in the direction of said photovoltaic cells and electrically connected to a photovoltaic cell.

73. The photovoltaic cell package of claim 72, wherein the thin film photovoltaic cells have a ratio of mass to surface area of less than about 60 milligrams/square centimeter.

74. The photovoltaic cell package of claim 73, wherein the thin film photovoltaic cells include semiconductors less than 10 microns thick.

75. The photovoltaic cell package of claim 74, wherein the thin film photovoltaic cells are (AlGaAs)-GaAs/CuInSe$_2$ mechanically stacked tandem cells.

76. A photovoltaic cell package providing processing protection for fragile, thin film photovoltaic cells and providing high specific power for the package, the invention comprising:

(a) a plurality of high conversion efficiency, high specific power thin film photovoltaic cells, including:
  (i) a double heterostructure CLEFT thin film cell; and
  (ii) a thin film heterojunction cell;

(b) a dielectric tape having a carrier surface for supporting said photovoltaic cells and an interconnect surface, said carrier surface and said interconnect surface being on opposite sides of said dielectric tape;

(c) interconnect means including an electrical circuit for electrically interconnecting said photovoltaic cells, said interconnect means supported by said interconnect surface, said electrical circuit including a plurality of contact fingers; and (d) means defining a plurality of primary openings in said dielectric tape, a primary opening being associated with a contact finger and positioned such that said contact finger can be directed through said primary opening and electrically connected to a photovoltaic cell.

77. The photovoltaic cell package of claim 76, wherein the thin film photovoltaic cells have a ratio of mass to surface area of less than about 60 milligrams/square centimeter.

78. The photovoltaic cell package of claim 77, wherein the thin film photovoltaic cells include semiconductors less than 10 microns thick.

79. The photovoltaic cell package of claim 78, wherein the thin film photovoltaic cells are (AlGaAs)-GaAs/CuInSe$_2$ mechanically stacked tandem cells.

* * * * *